(12) United States Patent
Hsieh et al.

(10) Patent No.: US 12,322,726 B2
(45) Date of Patent: Jun. 3, 2025

(54) METHOD OF FORMING AN INTEGRATED CIRCUIT PACKAGE HAVING A PADDING LAYER ON A CARRIER

(71) Applicant: Taiwan Semiconductor Manufacturing Company, Ltd., Hsinchu (TW)

(72) Inventors: Cheng-Hsien Hsieh, Kaohsiung (TW); Li-Han Hsu, Hsin-Chu (TW); Wei-Cheng Wu, Hsinchu (TW); Der-Chyang Yeh, Hsin-Chu (TW); Wei-Chih Lai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 469 days.

(21) Appl. No.: 17/683,377

(22) Filed: Mar. 1, 2022

(65) Prior Publication Data
US 2023/0282614 A1  Sep. 7, 2023

(51) Int. Cl.
*H01L 25/065* (2023.01)
*H01L 21/56* (2006.01)
(Continued)

(52) U.S. Cl.
CPC .......... *H01L 25/0652* (2013.01); *H01L 21/56* (2013.01); *H01L 23/3128* (2013.01); *H01L 23/3171* (2013.01); *H01L 23/481* (2013.01); *H01L 23/49827* (2013.01); *H01L 23/5384* (2013.01); *H01L 24/16* (2013.01); *H01L 24/32* (2013.01); *H01L 24/73* (2013.01);
(Continued)

(58) Field of Classification Search
CPC ............... H01L 25/0652; H01L 21/56; H01L 21/76898; H01L 23/3128; H01L 23/3171; H01L 2224/32195; H01L 23/5384; H01L 23/481; H01L 23/49827; H01L 24/13; H01L 24/16; H01L 24/19; H01L 24/20; H01L 24/32; H01L 24/56; H01L 24/81; H01L 25/50; H01L 2224/73253; H01L 2224/73204; H01L 2224/32145
See application file for complete search history.

(56) References Cited

U.S. PATENT DOCUMENTS 8,993,380 B2  3/2015  Hou et al.
9,281,254 B2  3/2016  Yu et al.
(Continued)

*Primary Examiner* — Khiem D Nguyen
(74) *Attorney, Agent, or Firm* — JCIPRNET

(57) ABSTRACT

A method of forming an integrated circuit package includes following operations. A padding layer is formed on a portion of a carrier. A first semiconductor die is placed on the padding layer and a second semiconductor die is placed on the carrier. The first semiconductor die and the second semiconductor die are encapsulated with a first encapsulation layer. A first redistribution layer structure is formed over the first semiconductor die, the second semiconductor die and the first encapsulation layer. A third semiconductor die is placed on the first redistribution layer structure. The third semiconductor die is encapsulated with a second encapsulation layer. A second redistribution layer structure is formed over the third semiconductor die and the second encapsulation layer. The carrier is debonded. The padding layer is removed, and therefore, a recess is formed in the first encapsulation layer.

20 Claims, 13 Drawing Sheets

100:100a,100b,100c
200:200a,200b,200c
300:300a,300b,300c,300d

(51) Int. Cl.
  *H01L 23/00*    (2006.01)
  *H01L 23/31*    (2006.01)
  *H01L 23/48*    (2006.01)
  *H01L 23/498*   (2006.01)
  *H01L 23/538*   (2006.01)

(52) U.S. Cl.
  CPC ............... *H01L 2224/1613* (2013.01); *H01L 2224/32145* (2013.01); *H01L 2224/32195* (2013.01); *H01L 2224/73204* (2013.01); *H01L 2224/73253* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2008/0174008 A1* | 7/2008 | Yang ............ G11C 5/063 257/E23.008 |
| 2011/0291288 A1* | 12/2011 | Wu ............... H01L 24/81 257/773 |
| 2013/0037950 A1* | 2/2013 | Yu ............... H01L 23/5226 257/E23.021 |
| 2016/0260684 A1* | 9/2016 | Zhai ............. H01L 25/0652 |
| 2018/0374824 A1* | 12/2018 | Yu ............... H01L 25/105 |
| 2019/0148276 A1* | 5/2019 | Chen ............ H01L 21/486 257/774 |

* cited by examiner

METHOD OF FORMING AN INTEGRATED CIRCUIT PACKAGE HAVING A PADDING LAYER ON A CARRIER

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. Although the existing integrated circuit packages have been generally adequate for their intended purposes, they have not been entirely satisfactory in all respects.

DETAILED DESCRIPTION

Figure 1:
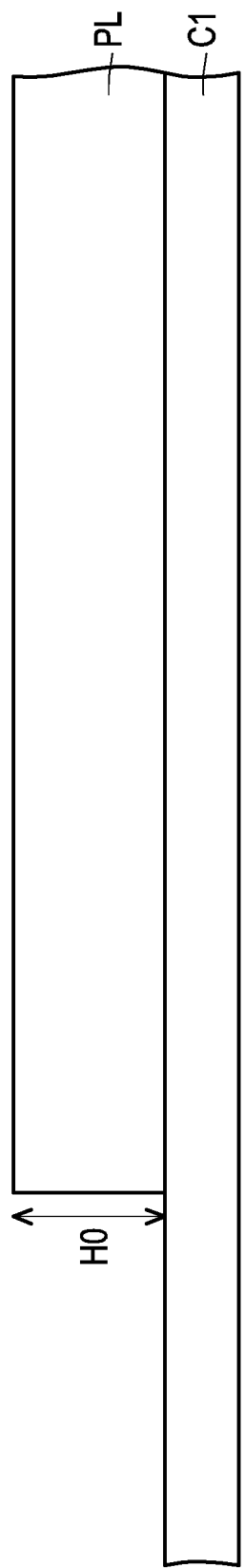
FIG. 1 to FIG. 8 are cross-sectional views of a method of forming an integrated circuit package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The thermal control may protect the devices or chips in the integrated circuit package from a thermal damage. Thicker silicon is desired because it can provide larger thermal mass for a high performance chip. However, the total Z height of the package constrains the silicon thickness. In the disclosure, with novel arrangement of multiple chips in different levels or tiers, the heat dissipation efficiency is effectively improved by increasing silicon thickness of the high-performance die without increasing the total height of the multi-chip semiconductor package.

FIG. 1 to FIG. 8 are cross-sectional views of a method of forming an integrated circuit package in accordance with some embodiments. It is understood that the disclosure is not limited by the method described below. Additional operations can be provided before, during, and/or after the method and some of the operations described below can be replaced or eliminated, for additional embodiments of the methods.

Although FIG. 1 to FIG. 8 are described in relation to a method, it is appreciated that the structures disclosed in FIG. 1 to FIG. 8 are not limited to such a method, but instead may stand alone as structures independent of the method.

Referring to FIG. 1, a carrier C1 is provided with a padding layer PL formed thereon. In some embodiments, the carrier C1 is a non-semiconductor material, such as a glass carrier, a ceramic carrier, or the like. In some embodiments, the padding layer PL includes a photo-sensitive material such as polybenzoxazole (PBO), polyimide (PI), benzocyclobutene (BCB), the like, or a combination thereof, and is formed by a photolithography process. In some embodiments, the padding layer PL include an inorganic material, such as silicon oxide, silicon nitride, silicon oxynitride, or any suitable dielectric material or an insulating material, and is formed by a deposition process followed by a laser drilling process. The padding layer PL is referred to as a "polymer layer", "dielectric layer", a "booster layer" or an "insulating layer" in some examples. In some embodiments, the thickness or height H0 of the padding layer PL ranges from about 200 um to 500 um.

Figure 2:
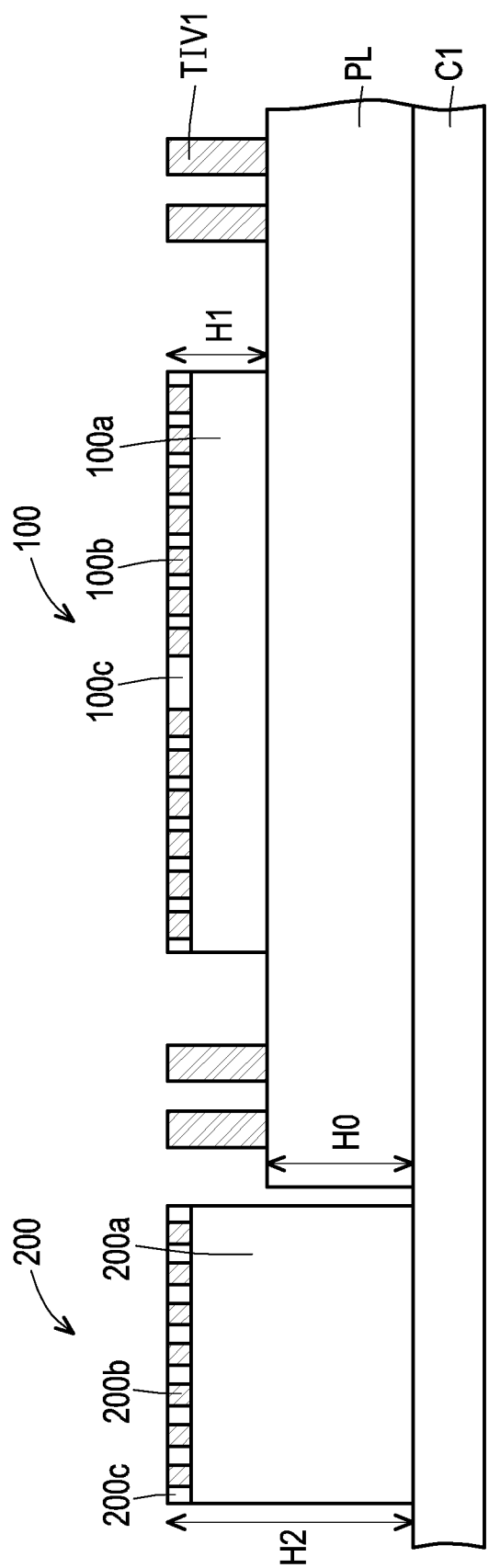

Referring to FIG. 2, through integrated fan-out vias TIV1 are formed on the padding layer PL. In some embodiments, the through integrated fan-out vias TIV1 include copper, nickel, titanium, the like, or a combination thereof, and are formed by photolithography, plating, and photoresist stripping processes. The through integrated fan-out vias TIV1 are in contact with the padding layer PL.

Thereafter, a semiconductor die 100 is placed on the padding layer P1 and a semiconductor die 200 is placed on the carrier C1. In some embodiments, the semiconductor die 100 is surrounded by the through integrated fan-out vias TIV1. In some embodiments, the semiconductor die 100 is adhered to the padding layer PL with a first die attach film (DAF) between the padding layer PL and the back side of the semiconductor die 100, and the semiconductor die 200 is adhered to the carrier C1 with a second die attach film (DAF) between the carrier C1 and the back side of the semiconductor die 200. In some embodiments, the semiconductor die 200 is separated from the padding layer PL by a distance. However, the disclosure is not limited thereto. In some embodiments, the semiconductor die 100 may be in contact with the sidewall of the padding layer PL.

Each of the semiconductor dies 100 and 200 may include a logic die, a memory die, a CPU, a GPU, an xPU, a MEMS die, a SoC die, or the like. The semiconductor dies 100 and 200 may have the same or different functions. In some embodiments, each of the semiconductor dies 100 and 200 is a SoC die.

In some embodiments, the semiconductor die 100 includes a substrate 100a, connectors 100b and a passivation layer 100c. The substrate 100a is a silicon substrate. The substrate 100a has a device layer (not shown) formed thereon. The device layer includes a transistor, an interconnect structure, etc., and the connectors 100b are formed over the substrate 100a and electrically connected to the device layer. The connectors 100b are metal pillars (e.g., copper pillars). The metal pillars include Cu, W, Ni, Sn, Ti, Au, an alloy or a combination thereof, and are formed by an electroplating process. The passivation layer 100c is formed around the connectors 100b. The passivation layer 100c includes a polymer material such as polybenzoxazole (PBO), polyimide, benzocyclobutene (BCB), the like, or a combination thereof. In some embodiments, the surfaces of the connectors 100b are flushed with the surface of the passivation layer 100c.

In some embodiments, the semiconductor die 200 includes a substrate 200a, connectors 200b and a passivation layer 200c. The materials and arrangements of elements of the semiconductor die 200 are similar to those of the semiconductor die 100, so the details are not iterated herein.

The difference between the semiconductor die 100 and the semiconductor die 200 lies in the critical dimensions (e.g., the minimum line width, the minimum hole size, etc.) and chip heights (e.g., the height from the substrate to the connectors or bumps).

The critical dimension of the semiconductor die 100 is much greater than the critical dimension of the semiconductor die 200. In some embodiments, the ratio of the critical dimension of the semiconductor die 100 to the critical dimension of the semiconductor die 200 is greater than 1.2, 1.5, 2.0, 2.5 or more. For example, the critical dimension of the semiconductor die 200 ranges from about 5 nm to 10 nm, and the critical dimension of the semiconductor die 200 ranges from about 1 nm to 4 nm. The die with the smallest critical dimension is referred to as a "high-performance die", a "key die" or a "core die" in some examples. In the disclosure, the high-performance die is the semiconductor die 200 through the specification.

The height H2 of the semiconductor die 200 is much greater than the height H1 of the semiconductor die 100. In some embodiments, the ratio of the height H2 of the semiconductor die 200 to the height H1 of the semiconductor die 100 is greater than 1.2, 1.5, 2.0, 2.5 or more. For example, the height H2 of the semiconductor die 200 ranges from about 200 um to 500 um, and the height H2 of the semiconductor die 200 ranges from about 600 um to 1000 um. In some embodiments, the height H2 of the semiconductor die 200 is substantially equal to the total height of the height H0 of the padding layer PL and the height H1 of the semiconductor die 100.

In some embodiments, the ratio of the silicon substrate 200a of the semiconductor die 200 to the silicon substrate 100a of the of the semiconductor die 100 is greater than 1.2, 1.5, 2.0, 2.5 or more. Thicker silicon substrate provides larger thermal mass for the high-performance die (e.g., semiconductor die 200), and therefore, the heat dissipation of the package is effectively reduced.

Figure 3:
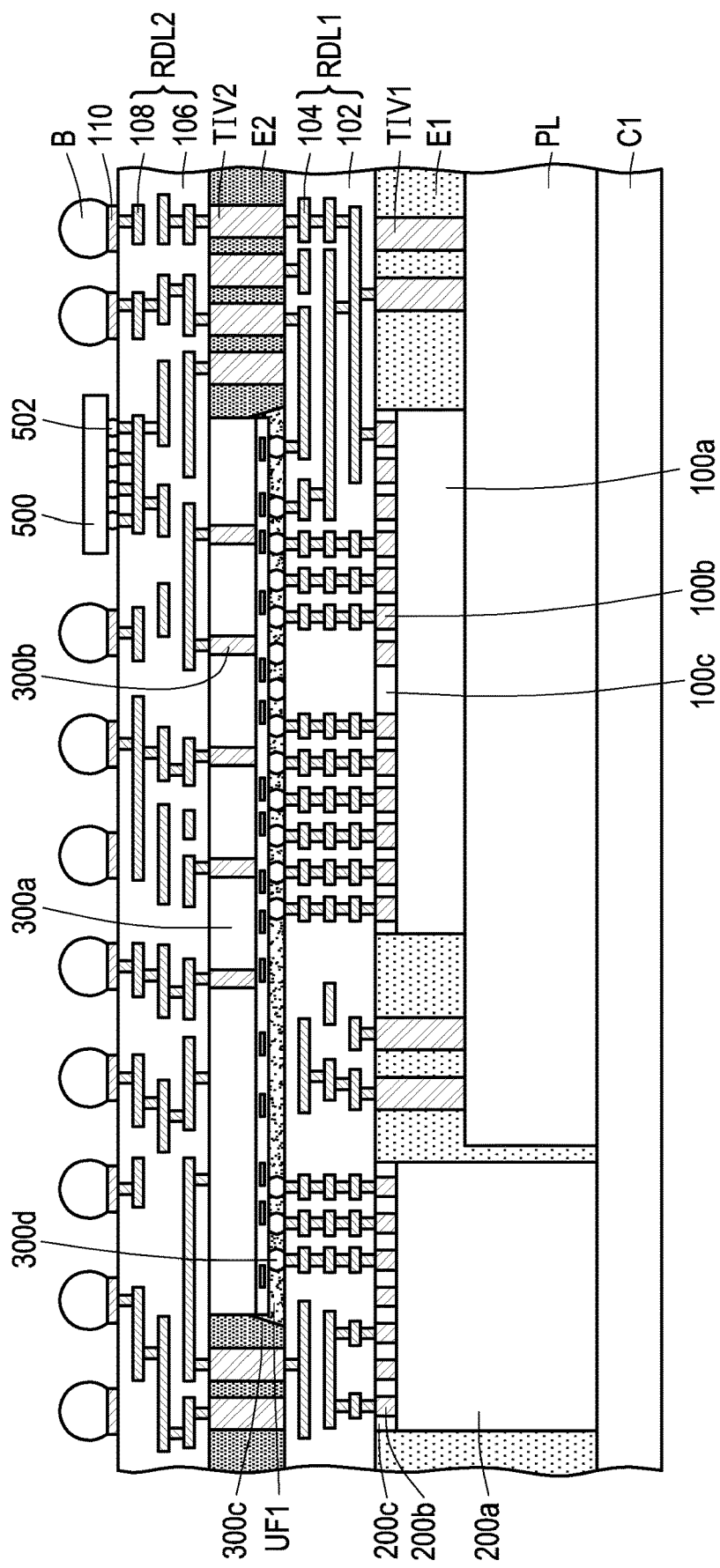

Referring to FIG. 3, an encapsulation layer E1 is formed around the semiconductor die 100, the semiconductor die 200, and the through integrated fan-out vias TIV1. In some embodiments, the encapsulation layer E1 is in contact with the padding layer PL and fills in the gap between the padding layer PL and the semiconductor die 200. The encapsulation layer E1 may be formed by a molding process followed by a grinding process. In some embodiments, the surfaces of the connectors 100b of the semiconductor die 100, the surfaces of the connectors 200b of the semiconductor die 200, the surfaces of the through integrated fan-out vias TIV1 and the surface of the encapsulation layer E1 are flushed with each other.

Thereafter, a redistribution layer structure RDL1 is formed over and electrically connected to the semiconductor die 100, the semiconductor die 200, and the through integrated fan-out vias TIV1. In some embodiments, the redistribution layer structure RDL1 includes redistribution layers 104 embedded by polymer layers 102. In some embodiments, each of the redistribution layers 104 includes copper, nickel, titanium, the like, or a combination thereof, and is formed by photolithography, plating, and photoresist stripping processes. In some embodiments, each of the polymer layers 102 includes a polymer material such as polybenzoxazole (PBO), polyimide (PI), benzocyclobutene (BCB), a combination thereof or the like, and is formed by a suitable fabrication technique such as spin-coating, lamination, deposition or the like.

Still referring to FIG. 3, through integrated fan-out vias TIV2 are formed over and electrically connected to the redistribution layer structure RDL1. In some embodiments, the through integrated fan-out vias TIV2 include copper, nickel, titanium, the like, or a combination thereof, and are formed by photolithography, plating, and photoresist stripping processes.

Thereafter, a semiconductor die 300 is provided and bonded to (e.g., flip-chipped to) the redistribution layer structure RDL1. In some embodiments, the semiconductor die 300 is surrounded by the through integrated fan-out vias TIV2. The semiconductor die 300 may include a logic die, a memory die, a CPU, a GPU, an xPU, a MEMS die, a SoC die, or the like. The semiconductor dies 100, 200 and 300 may have the same or different functions. In some embodiments, each of the semiconductor dies 100, 200 and 300 is a SoC die.

In some embodiments, the semiconductor die 300 includes a substrate 300a, through substrate vias 300b, an interconnect structure 300c and bumps 300d. The substrate 300a is a silicon substrate. The substrate 300a has a transistor (not shown) formed thereon, and the interconnect structure 300c is formed over the substrate 300a and electrically connected to the transistor. In some embodiments, through substrate vias 300b (also called "through silicon vias" in some examples) penetrate through the substrate 300a and are landed on some conductive features of the interconnect structure 300c. The interconnect structure 300c includes conductive features embedded by dielectric layers. The conductive features include metal lines, metal vias, metal pads and/or metal connectors. In some embodiments, each conductive feature includes Cu, Al, Ti, Ta, W, Ru, Co, Ni, the like, or a combination thereof. In some embodiments, each dielectric layer includes silicon oxide, silicon nitride, silicon oxynitirde, SiOC, the like, or a combination thereof. An etching stop layer may be interposed between two adjacent dielectric layers. The dielectric layers of the interconnect structure 300c may be replaced by polymer layers or insulating layers as needed.

The bumps 300d are formed over and electrically connected to the interconnect structure 300c. The bumps 300d include solder bumps, solder caps formed on metal pillars (e.g., copper pillars), or the like. The bumps 300d may be formed by a suitable process such as evaporation, electroplating, ball drop, or screen printing. In some embodiments, the semiconductor die 300 is turned over and then bonded to the redistribution layer structure RDL1 through the bumps 300d.

Afterwards, an underfill layer UF1 is formed to fill the space between the redistribution layer structure RDL1 and the semiconductor die 300, and surrounds the bumps 300d. In some embodiments, the underfill layer UF1 includes a molding compound such as epoxy, and is formed using dispensing, injecting, and/or spraying process.

Still referring to FIG. 3, an encapsulation layer E2 is formed around the semiconductor die 300 and the through integrated fan-out vias TIV2. The encapsulation layer E2 may be formed by a molding process followed by a grinding process. In some embodiments, the surface of the semiconductor die 300, the surfaces of the through integrated fan-out vias TIV2 and the surface of the encapsulation layer E2 are flushed with each other.

Thereafter, a redistribution layer structure RDL2 is formed over and electrically connected to the semiconductor die 300 and the through integrated fan-out vias TIV2. In some embodiments, the redistribution layer structure RDL2 includes redistribution layers 108 embedded by polymer layers 106. In some embodiments, each of the redistribution layers 108 includes copper, nickel, titanium, the like, or a combination thereof, and is formed by photolithography, plating, and photoresist stripping processes. In some embodiments, each of the polymer layers 106 includes a polymer material such as polybenzoxazole (PBO), polyimide (PI), benzocyclobutene (BCB), a combination thereof or the like, and is formed by a suitable fabrication technique such as spin-coating, lamination, deposition or the like.

Afterwards, under bump metallization (UBM) pads 110 are formed over the redistribution layer structure RDL2. In some embodiments, the UBM pads 110 include copper, nickel, titanium, the like, or a combination thereof, and is formed by photolithography, plating, and photoresist stripping processes. The UBM pads 110 are regarded as part of the redistribution layer structure RDL2 in some examples.

In some embodiments, bumps B are formed over and electrically connected to the UBM pads 110. The bumps B include solder bumps, solder caps formed on metal pillars (e.g., copper pillars), or the like. The bumps B may be formed by a suitable process such as evaporation, electroplating, ball drop, or screen printing. The bumps B are referred to as "ball grid array (BGA) bumps" in some examples.

In some embodiments, at least one integrated passive device (IPD) 500 is provided and bonded to the redistribution layer structure RDL2 through the bumps 502. The integrated passive device 500 may include a capacitor, an inductor or a resistor, or the like. For example, the integrated passive device 500 is a capacitor. In some embodiments, the bumps 502 include solder bumps, solder caps formed on metal pillars (e.g., copper pillars), or the like. The bumps 502 may be formed by a suitable process such as evaporation, electroplating, ball drop, or screen printing.

Figure 4:
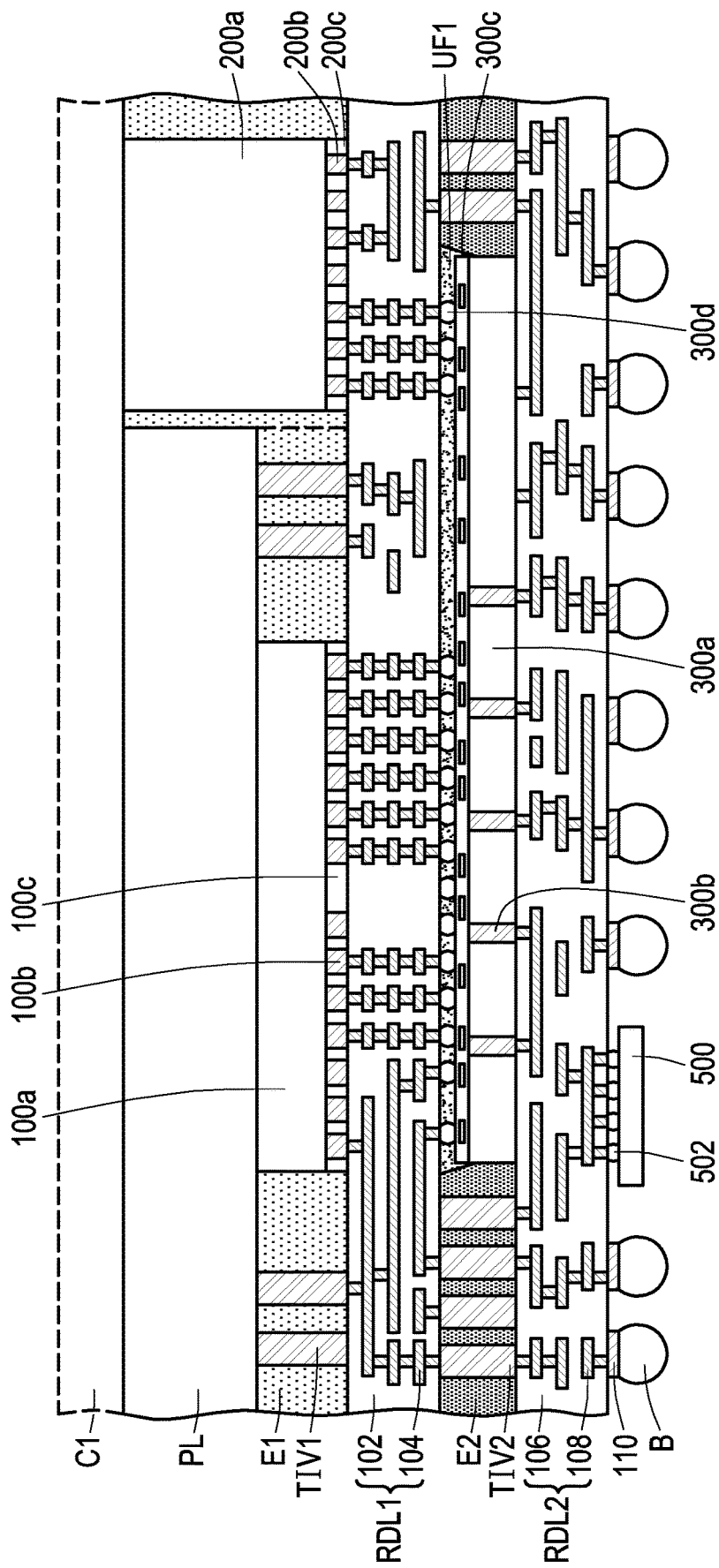

Referring to FIG. 4, the carrier C1 is then removed from the structure formed thereon. In some embodiments, the structure with the carrier C1 is turned over, such that the carrier C1 faces up for the subsequent processes. In some embodiments, the carrier C1 is debonded from the back sides of the semiconductor dies 100 and 200. In some embodiments, a debonding layer between the carrier C1 and the semiconductor die 200 and between the carrier C1 and the padding layer PL is decomposed under heat of light, and the carrier C1 is then released from the structure formed thereon.

Figure 5:
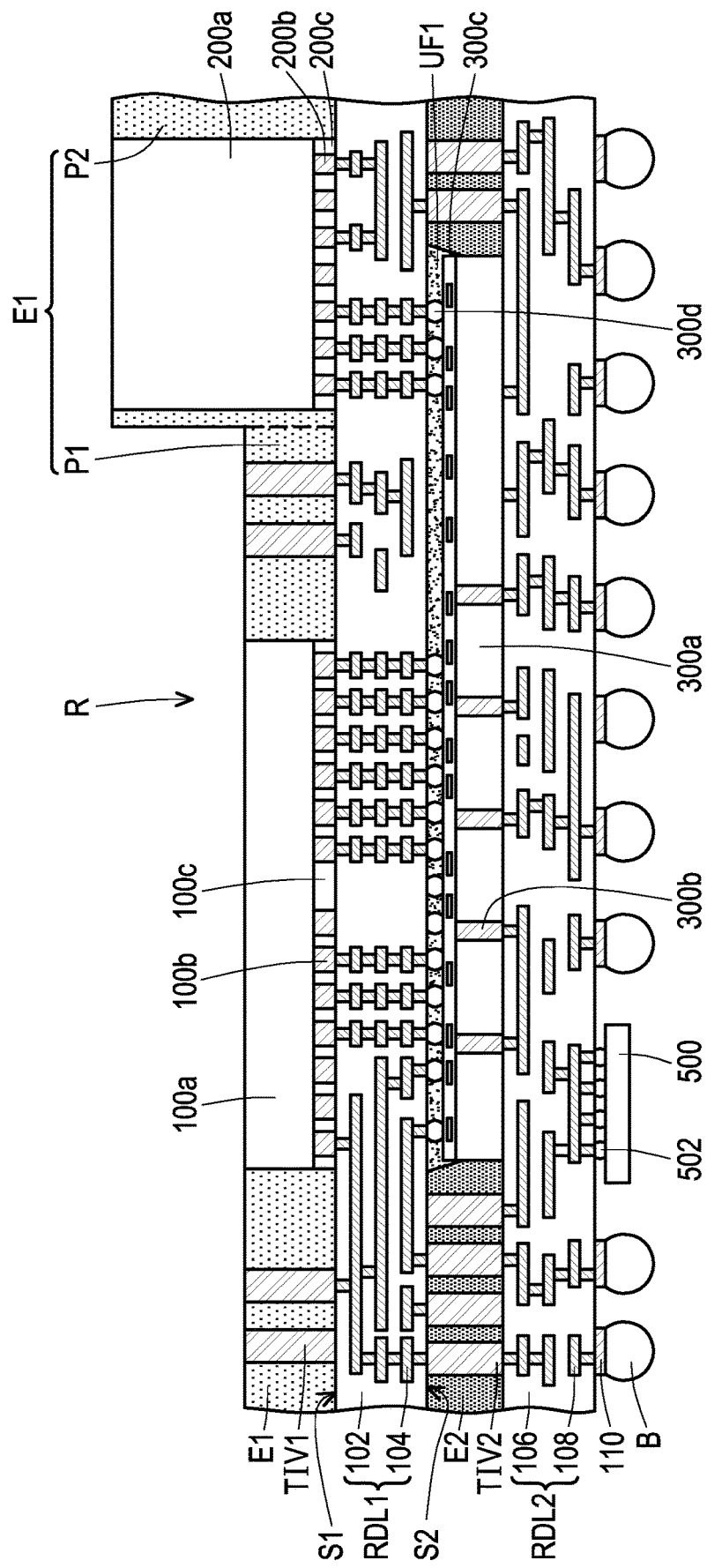

Referring to FIG. 5, the padding layer PL is removed from the backside of the semiconductor die 100. The removing process includes an etching process or a laser drilling process. An intermediate structure including two redistribution layer structures and three semiconductor dies is thus formed at this stage. As shown in FIG. 5, upon the removing process of the padding layer PL, a recess R is formed in the encapsulation layer E1 and exposes the back side of the semiconductor die 100. Specifically, the encapsulation layer E1 has a first portion P1 and a second portion P2 protruded from a top surface of the first portion P1 and a sidewall of the second portion P2 is exposed. In some embodiments, the first portion P1 encapsulates the sidewall of the semiconductor die 100 and the sidewalls of the through integrated fan-out vias TIV1, and the second portion P2 encapsulates the sidewall of the semiconductor die 200. In some embodiments, the first DAF adhered to the semiconductor die 100 and the second DAF adhered to the semiconductor die 200 may be removed. In other embodiments, the first DAF adhered to the semiconductor die 100 and the second DAF adhered to the semiconductor die 200 may remain as needed.

Figure 6:
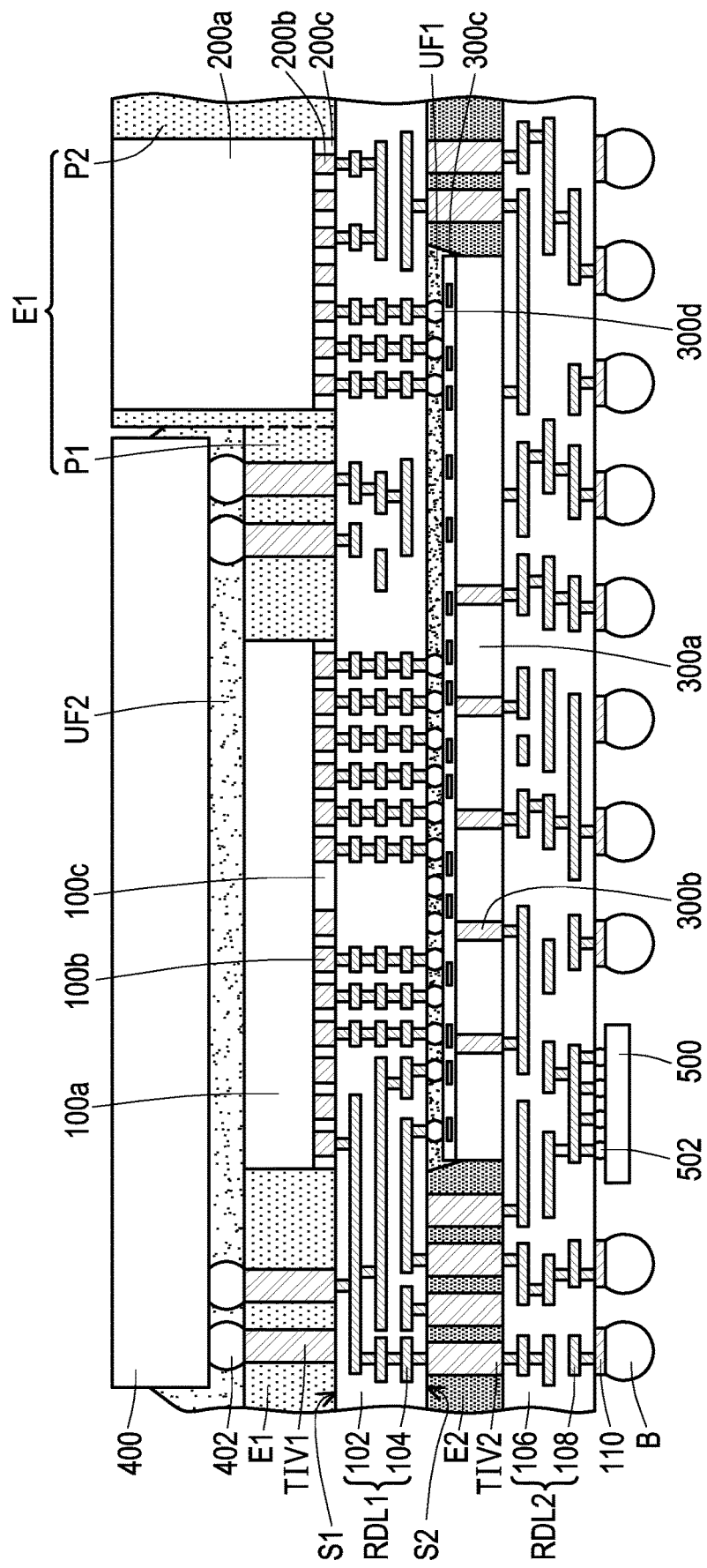

Referring to FIG. 6, a semiconductor die 400 is provided and bonded to the through integrated fan-out vias TIV2 through the bumps 402. The semiconductor die 400 may include a logic die, a memory die, a CPU, a GPU, an xPU, a MEMS die, a SoC die, or the like. In some embodiments, the bumps 402 include solder bumps, solder caps formed on metal pillars (e.g., copper pillars), or the like. The bumps 402 may be formed by a suitable process such as evaporation, electroplating, ball drop, or screen printing. The semiconductor dies 100, 200, 300 and 400 may have the same or different functions. In some embodiments, each of the semiconductor dies 100, 200 and 300 is a SoC die, and the semiconductor die 400 is a memory die (e.g., DRAM die). In some embodiments, the surface of the semiconductor die 400 is flushed with the surface of the semiconductor die 200. In other embodiments, the surface of the semiconductor die 400 may be different from (e.g., lower than or higher than) the surface of the semiconductor die 200.

Thereafter, an underfill layer UF2 is formed to fill the space between the semiconductor die 400 and the semiconductor die 200, and surrounds the bumps 402. In some embodiments, the underfill layer UF2 includes a molding compound such as epoxy, and is formed using dispensing, injecting, and/or spraying process. In some embodiments, the underfill layer UF2 partially fills in the gap between the semiconductor die 400 and the second portion P2 of the encapsulation layer E1, as shown in FIG. 6. However, the disclosure is not limited thereto. In some embodiments (not shown), the underfill layer UF2 completely fills the gap between the semiconductor die 400 and the second portion P2 of the encapsulation layer E1. In some embodiments, the underfill layer UF2 and the encapsulation layer E1 include difference materials, so an interface is present between the underfill layer UF2 and the encapsulation layer E1. In other embodiments, the underfill layer UF2 and the encapsulation layer E1 are made by the same material, so an interface is not present between the underfill layer UF2 and the encapsulation layer E1.

Figure 7:
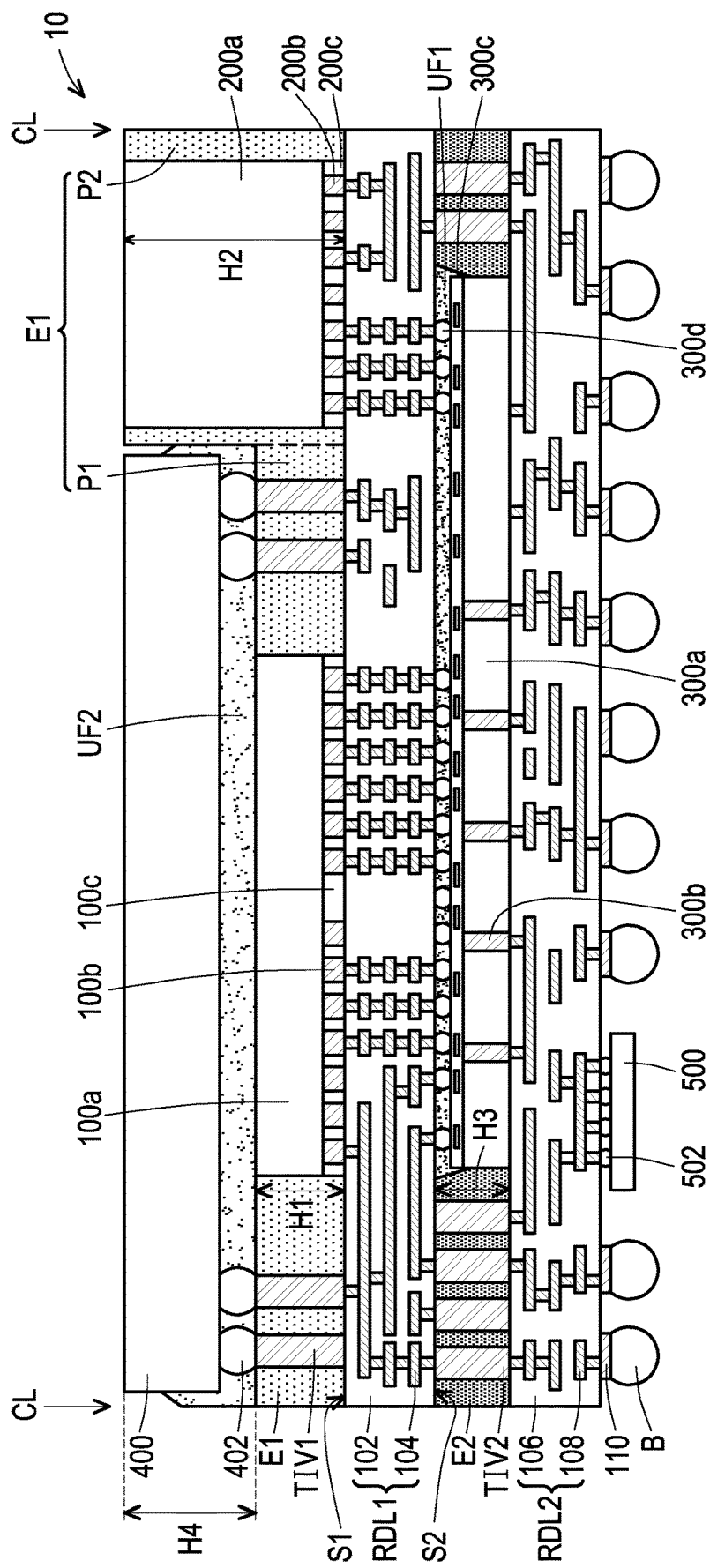

Referring to FIG. 7, a wafer dicing process is performed on the structure of FIG. 6 along the cutting lines CL, so as to cut through the encapsulation layer E1, the redistribution layer structure RDL2, the encapsulation layer E2 and the redistribution layer structure RDL1. After the wafer dicing process or singulation process, the adjacent integrated circuit packages 10 are separated from each other, as shown in FIG. 7. The integrated circuit package 10 of some embodiments is thus completed. In some embodiments, a board substrate such as a printed circuit board (PCB) and/or an interposer substrate such as a silicon interposer or an organic interposer may be provided below and bonded to the integrated circuit package 10 through the bumps B.

Possible modifications and alterations can be made to the described integrated circuit package 10. These modifications and alterations are provided for illustration purposes, and are not construed as limiting the present disclosure.

Figure 8:
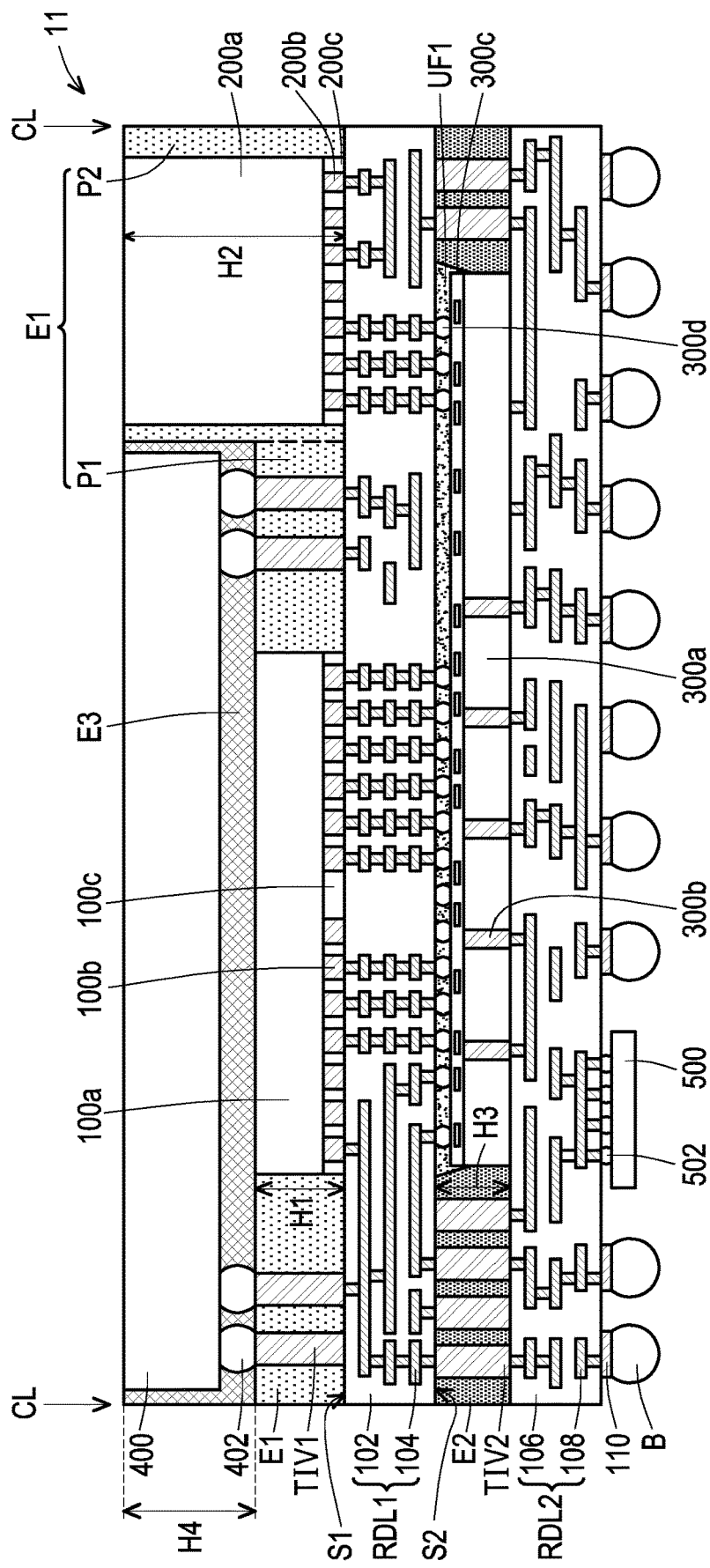

The integrated circuit package 11 of FIG. 8 is similar to the integrated circuit package 10 of FIG. 7, wherein like reference numerals refer to like elements. The materials, configurations and forming methods of elements of FIG. 7 may refer to those of similar elements described in the previous embodiments.

The difference between the integrated circuit package 11 of FIG. 8 and the integrated circuit package 10 of FIG. 7 lies in the operation of encapsulating the semiconductor die 400. In the integrated circuit package 10 of FIG. 7, the semiconductor die 400 is encapsulated by an underfill layer UF2. However, in the integrated circuit package 11 of FIG. 8, the semiconductor die 400 is encapsulated by an encapsulation layer E3.

Specifically, the encapsulation layer E3 is formed around the semiconductor die 400 and surround the bumps 402. In some embodiments, the encapsulation layer E3 is in contact with the encapsulation layer E1 and completely fills the gap between the semiconductor die 400 and the second portion P2 of the encapsulation layer E1. The encapsulation layer E3 may be formed by a molding process followed by a grinding process. In some embodiments, the surface of the semiconductor die 400, the surface of the encapsulation layer E3, the surface of the semiconductor die 200 and the surface of the encapsulation layer E1 are flushed with each other. In some embodiments, the encapsulation layer E3 and the encapsulation layer E1 include difference materials, so an interface is present between the encapsulation layer E3 and the encapsulation layer E1. In other embodiments, the encapsulation layer E3 and the encapsulation layer E1 are made by the same material, so an interface is not present between the encapsulation layer E3 and the encapsulation layer E1.

The structures of integrated circuit packages of some embodiments are described below with reference to FIG. 7 to FIG. 8.

In some embodiments, an integrated circuit package 10/11 includes a first redistribution layer structure RDL1, a first semiconductor die 100, a second semiconductor die 200 and a third semiconductor die 300. The first redistribution layer structure RDL1 has a first side S1 and a second side S2 opposite to each other. The first semiconductor die 100 and a second semiconductor die 200 are electrically connected to the first side S1 of the first redistribution layer structure RDL1 and encapsulated by a first encapsulation layer E1, wherein the first semiconductor die 100 and the second semiconductor die 200 have different heights, the first encapsulation layer E1 has a first portion P1 and a second portion P2 protruded from a top surface of the first portion P1 and a sidewall of the second portion P2 is exposed, the first portion P1 encapsulates the first semiconductor die 100, and the second portion P2 encapsulates the second semiconductor die 200. The third semiconductor die 300 is electrically connected to the second side S2 of the first redistribution layer structure RDL1 and encapsulated by a second encapsulation layer E2.

In some embodiments, the integrated circuit package 10/11 further includes a fourth semiconductor die 400 disposed on the second portion P2 of the first encapsulation layer E1. In some embodiments, the fourth semiconductor die 400 is separated from the first portion P1 and the second portion P2 of the first encapsulation layer E1. In some embodiments, a surface of the fourth semiconductor die 400 is flushed with a surface of the second semiconductor die 200. In some embodiments, a critical dimension of the second semiconductor die 200 is less than a critical dimension of the first semiconductor die 100.

In some embodiments, the height H2 of the semiconductor die 200 is greater than the height H1 of the semiconductor die 100. In some embodiments, the height H2 of the semiconductor die 200 is substantially equal to the total height of the height H1 of the semiconductor die 100 and the height H4 of the semiconductor die 400.

In some embodiments, the height H1 of the semiconductor die 100 ranges from about 200 um to 500 um, and the height H2 of the semiconductor die 200 ranges from about 600 um to 1000 um, and the height H4 of the semiconductor die 400 ranges from about 200 um to 500 um. In some embodiments, the height H3 of the semiconductor die 300 ranges from about 200 um to 500 um.

In some embodiments, the integrated circuit package 10/11 further includes a second redistribution layer structure RDL2 electrically connected to the third semiconductor die 300 and opposite to the first distribution layer structure RDL1. In some embodiments, the integrated circuit package 10/11 further includes bumps B electrically connected to the second redistribution layer structure RDL2 and opposite to the third semiconductor die 300. In some embodiments, the integrated circuit package 10/11 further includes at least one integrated passive device 500 electrically connected to the second redistribution layer structure RDL2 and opposite to the third semiconductor die 300.

The above embodiments in which the semiconductor dies 100 and 200 are formed prior to the formation of the semiconductor dies 300 and 400 are provided for illustration purposes, and are not construed as limiting the present disclosure. In other embodiments, the forming sequence of these semiconductor dies 100 to 400 can be adjusted as needed.

FIG. 9 to FIG. 13 are cross-sectional views of integrated circuit packages in accordance with some embodiments, wherein like reference numerals refer to like elements. Possible modifications and alterations can be made to the described elements. These modifications and alterations are provided for illustration purposes, and are not construed as limiting the present disclosure. It is understood that the disclosure is not limited by the method described below. Additional operations can be provided before, during, and/or after the method and some of the operations described below can be replaced or eliminated, for additional embodiments of the methods.

Although FIG. 9 to FIG. 13 are described in relation to a method, it is appreciated that the structures disclosed in FIG. 9 to FIG. 13 are not limited to such a method, but instead may stand alone as structures independent of the method.

Figure 9:
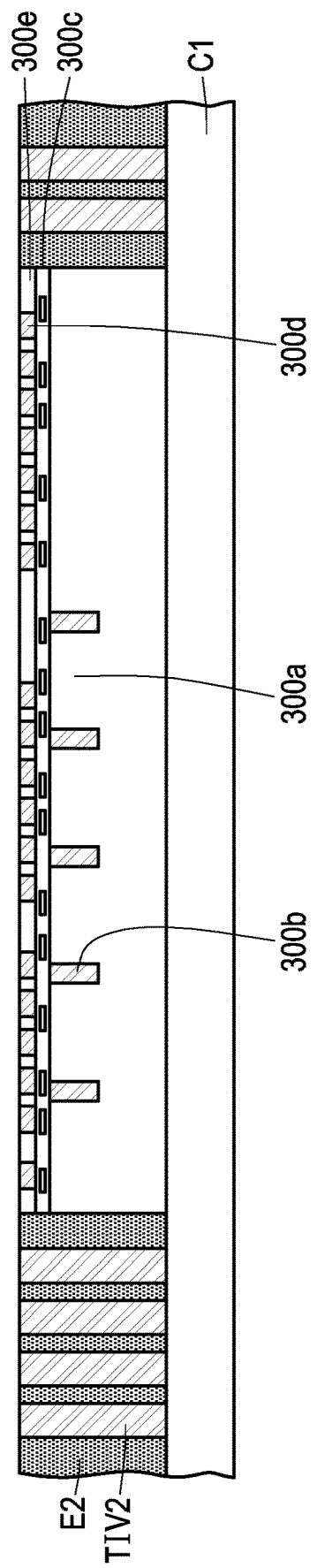
FIG. 9 to FIG. 13 are cross-sectional views of a method of forming an integrated circuit package in accordance with some embodiments.

Referring to FIG. 9, a carrier C1 is provided. In some embodiments, the carrier C1 is a non-semiconductor material, such as a glass carrier, a ceramic carrier, or the like. Thereafter, through integrated fan-out vias TIV2 are formed on the carrier C1. In some embodiments, the through integrated fan-out vias TIV2 include copper, nickel, titanium, the like, or a combination thereof, and are formed by photolithography, plating, and photoresist stripping processes.

Afterwards, a semiconductor die 300 is placed on the carrier C1. In some embodiments, the semiconductor die 300 is surrounded by the through integrated fan-out vias TIV2. In some embodiments, the semiconductor die 300 is adhered to the carrier C1 with a third die attach film (DAF) between the carrier C1 and the back side of the semiconductor die 300.

The semiconductor die 300 may include a logic die, a memory die, a CPU, a GPU, an xPU, a MEMS die, a SoC die, or the like. In some embodiments, the semiconductor die 300 is a SoC die.

In some embodiments, the semiconductor die 300 includes a substrate 300a, through substrate vias 300b, an interconnect structure 300c, connectors 300d and a passivation layer 300e. The substrate 300a is a silicon substrate. The substrate 300a has a transistor (not shown) formed thereon, and the interconnect structure 300c is formed over the substrate 300a and electrically connected to the transistor. In some embodiments, the substrate 300a has through substrate vias 300b (also called "through silicon vias" in some examples) formed therein. In some embodiments, ends of the through substrate vias 300b are landed on some conductive features of the interconnect structure 300c, and opposite ends of the through substrate vias 300b are not revealed from the back surface of the substrate 300a at this stage. The interconnect structure 300c includes conductive features embedded by dielectric layers. The conductive features include metal lines, metal vias, metal pads and/or metal connectors. In some embodiments, each conductive feature includes Cu, Al, Ti, Ta, W, Ru, Co, Ni, the like, or a combination thereof. In some embodiments, each dielectric layer includes silicon oxide, silicon nitride, silicon oxynitirde, SiOC, the like, or a combination thereof. An etching stop layer may be interposed between two adjacent dielectric layers. The dielectric layers of the interconnect structure 300c may be replaced by polymer layers or insulating layers as needed. The connectors 300d are metal pillars (e.g., copper pillars). The metal pillars include Cu, W, Ni, Sn, Ti, Au, an alloy or a combination thereof, and are formed by an electroplating process. The passivation layer 300e is formed around the connectors 300d. The passivation layer 300e includes a polymer material such as polybenzoxazole (PBO), polyimide, benzocyclobutene (BCB), the like, or a combination thereof. In some embodiments, the surfaces of the connectors 300d are flushed with the surface of the passivation layer 300e.

An encapsulation layer E2 is then formed around the semiconductor die 300 and the through integrated fan-out vias TIV2. The encapsulation layer E2 may be formed by a molding process followed by a grinding process. In some embodiments, the surface of the semiconductor die 300, the surfaces of the through integrated fan-out vias TIV2 and the surface of the encapsulation layer E2 are flushed with each other.

Figure 10:
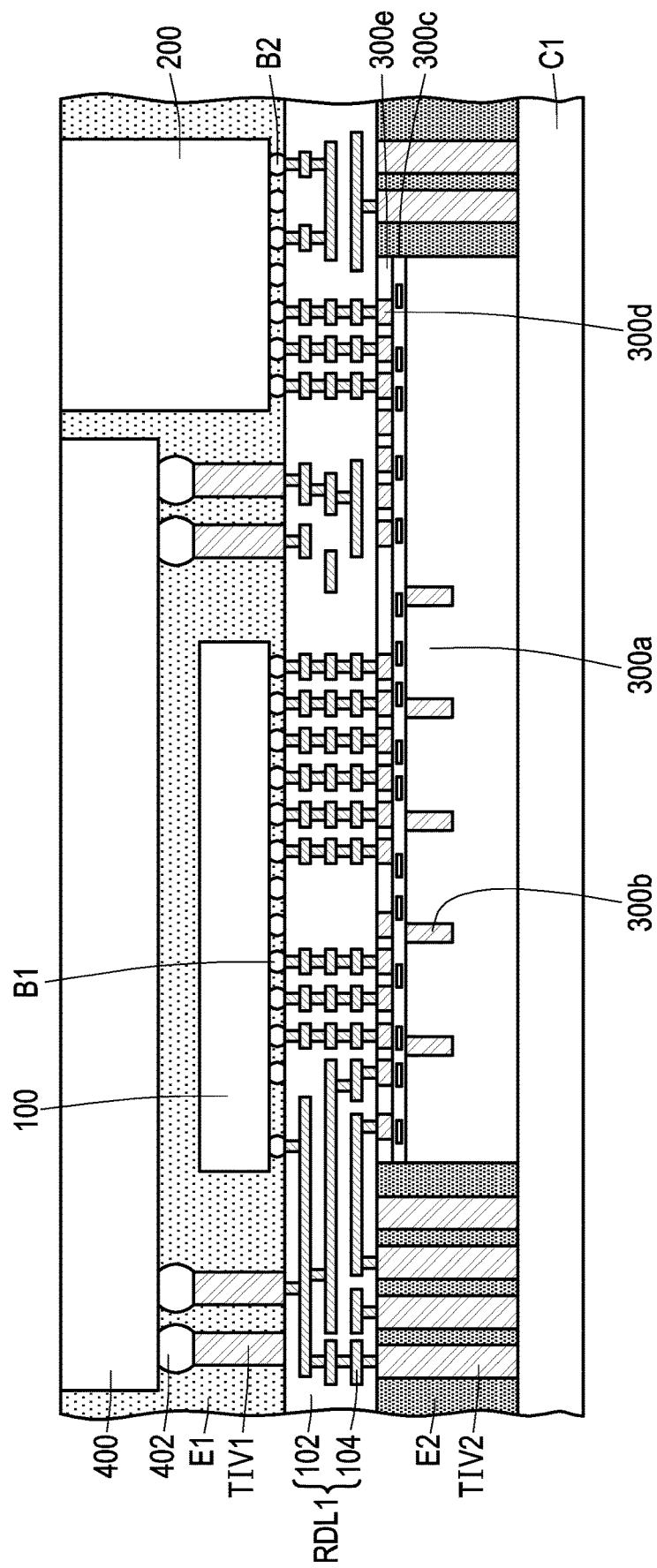

Referring to FIG. 10, a redistribution layer structure RDL1 is formed over and electrically connected to the semiconductor die 300 and the through integrated fan-out vias TIV2. In some embodiments, the redistribution layer structure RDL1 includes redistribution layers 104 embedded by polymer layers 102. In some embodiments, each of the redistribution layers 104 includes copper, nickel, titanium, the like, or a combination thereof, and is formed by photolithography, plating, and photoresist stripping processes. In some embodiments, each of the polymer layers 102 includes a polymer material such as polybenzoxazole (PBO), polyimide (PI), benzocyclobutene (BCB), a combination thereof or the like, and is formed by a suitable fabrication technique such as spin-coating, lamination, deposition or the like.

Thereafter, through integrated fan-out vias TIV1 are formed on the padding layer PL. In some embodiments, the through integrated fan-out vias TIV1 include copper, nickel, titanium, the like, or a combination thereof, and are formed by photolithography, plating, and photoresist stripping processes. In some embodiments, the heights of the through integrated fan-out vias TIV1 are equal to the height of the semiconductor die 100. However, the disclosure is not limited thereto. In other embodiments, the heights of the through integrated fan-out vias TIV1 are different from (e.g., greater than) the height of the semiconductor die 100.

Afterwards, a semiconductor die 100 and a semiconductor die 200 are provided and placed side by side on the redistribution layer structure RDL1. In some embodiments, the semiconductor die 100 is bonded to the redistribution layer structure RDL1 through the bumps B1, and the semiconductor die 200 is bonded to the redistribution layer structure RDL1 through the bumps B2.

Each of the semiconductor dies 100 and 200 may include a logic die, a memory die, a CPU, a GPU, an xPU, a MEMS die, a SoC die, or the like. The semiconductor dies 100 and 200 may have the same or different functions. In some embodiments, each of the semiconductor dies 100 and 200 is a SoC die.

In some embodiments, the semiconductor die 100 includes a first silicon substrate and a first device layer formed thereon. The first device layer includes a first transistor, a first interconnect structure, etc., and the bumps B1 are formed over the first silicon substrate and electrically connected to the first device layer. In some embodiments, the bumps B1 include solder bumps, solder caps formed on metal pillars (e.g., copper pillars), or the like. The bumps B1 may be formed by a suitable process such as evaporation, electroplating, ball drop, or screen printing.

In some embodiments, the semiconductor die 200 includes a second silicon substrate and a second device layer formed thereon. The second device layer includes a second transistor, a second interconnect structure, etc., and the bumps B2 are formed over the second silicon substrate and electrically connected to the second device layer. In some embodiments, the bumps B2 include solder bumps, solder caps formed on metal pillars (e.g., copper pillars), or the like. The bumps B2 may be formed by a suitable process such as evaporation, electroplating, ball drop, or screen printing.

The difference between the semiconductor die 100 and the semiconductor die 200 lies in the critical dimensions (e.g., the minimum line width, the minimum hole size, etc.) and chip heights (e.g., the height from the substrate to the connectors or bumps).

The critical dimension of the semiconductor die 100 is much greater than the critical dimension of the semiconductor die 200. In some embodiments, the ratio of the critical dimension of the semiconductor die 100 to the critical dimension of the semiconductor die 200 is greater than 1.2, 1.5, 2.0, 2.5 or more. For example, the critical dimension of the semiconductor die 200 ranges from about 5 nm to 10 nm, and the critical dimension of the semiconductor die 200 ranges from about 1 nm to 4 nm. The die with the smallest critical dimension is referred to as a "high-performance die", a "key die" or a "core die" in some examples. In the disclosure, the high-performance die is the semiconductor die 200 through the specification.

The height H2 of the semiconductor die 200 is much greater than the height H1 of the semiconductor die 100. In some embodiments, the ratio of the height H2 of the semiconductor die 200 to the height H1 of the semiconductor die 100 is greater than 1.2, 1.5, 2.0, 2.5 or more. For example, the height H1 of the semiconductor die 100 ranges from about 200 um to 500 um, and the height H2 of the semiconductor die 200 ranges from about 600 um to 1000 um.

In some embodiments, the ratio of the second silicon substrate of the semiconductor die 200 to the first silicon substrate of the of the semiconductor die 100 is greater than 1.2, 1.5, 2.0, 2.5 or more. Thicker silicon substrate provides larger thermal mass for the high-performance die (e.g., semiconductor die 200), and therefore, the heat dissipation of the package is effectively reduced.

Still referring to FIG. 10, a semiconductor die 400 is provided and placed on the semiconductor die 100. In some embodiments, the semiconductor die 400 is bonded to the through integrated fan-out vias TIV2 through the bumps 402. The semiconductor die 400 may include a logic die, a memory die, a CPU, a GPU, an xPU, a MEMS die, a SoC die, or the like. In some embodiments, the bumps 402 include solder bumps, solder caps formed on metal pillars (e.g., copper pillars), or the like. The bumps 402 may be formed by a suitable process such as evaporation, electroplating, ball drop, or screen printing. The semiconductor dies 100, 200, 300 and 400 may have the same or different functions. In some embodiments, each of the semiconductor dies 100, 200 and 300 is a SoC die, and the semiconductor die 400 is a memory die (e.g., DRAM die). In some embodiments, the surface of the semiconductor die 400 is flushed with the surface of the semiconductor die 200. In other embodiments, the surface of the semiconductor die 400 may be different from (e.g., lower than or higher than) the surface of the semiconductor die 200.

Thereafter, an encapsulation layer E1 is formed around the semiconductor die 100, the semiconductor die 200, the semiconductor die 400 and the through integrated fan-out vias TIV1. The encapsulation layer E1 may be formed by a molding process followed by a grinding process. In some embodiments, the surface of the semiconductor die 400, the surface of the semiconductor die 200, the surfaces of the through integrated fan-out vias TIV1 and the surface of the encapsulation layer E1 are flushed with each other. In some embodiments, the encapsulation layer E1 surrounds the bumps B1 and B2. However, the disclosure is not limited thereto. In other embodiments, before the operation of forming the encapsulation layer E1, a first underfill layer is optionally formed between the semiconductor die 100 and the redistribution layer structure RDL1 and surrounds the bumps B1, and a second underfill layer is optionally formed between the semiconductor die 200 and the redistribution layer structure RDL1 and surrounds the bumps B2.

Figure 11:
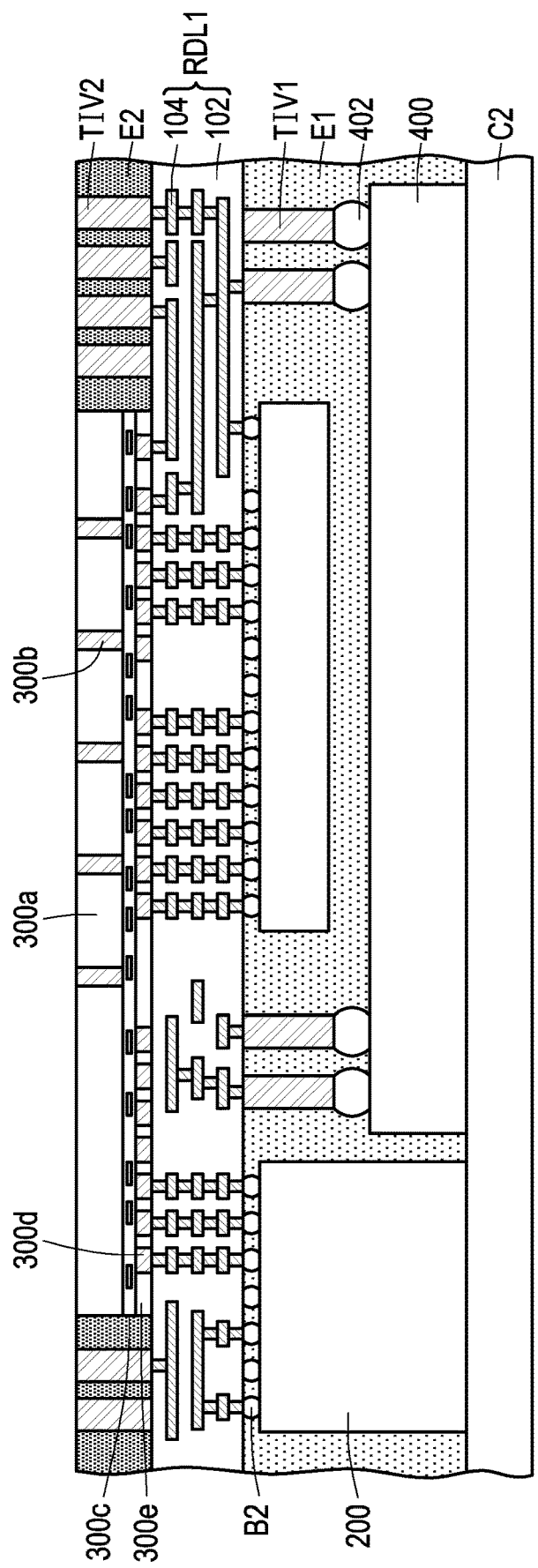

Referring to FIG. 11, a carrier C2 is bonded to the semiconductor die 200 and the semiconductor die 400, and the structure with the carrier C2 is turned over such that the carrier C1 faces up for the subsequent processes. In some embodiments, the carrier C2 is a non-semiconductor material, such as a glass carrier, a ceramic carrier, or the like. In some embodiments, the semiconductor die 100 is adhered to the carrier C2 with a first die attach film (DAF) between the carrier C2 and the back side of the semiconductor die 100, and the semiconductor die 200 is adhered to the carrier C2 with a second die attach film (DAF) between the carrier C2 and the back side of the semiconductor die 200.

Thereafter, the carrier C1 is removed from the structure formed thereon. In some embodiments, the carrier C1 is debonded from the back side of the semiconductor die 300. In some embodiments, a debonding layer between the carrier C1 and the semiconductor die 300 is decomposed under heat of light, and the carrier C1 is then released from the structure formed thereon.

Afterwards, the substrate 300a of the semiconductor die 300 is thinned, until the through substrate vias 300b are exposed from the back side of the semiconductor die 300. In some embodiments, the thinning process includes a suitable grinding process and/or a polishing process, such as chemical mechanical polishing (CMP) or the like. In some embodiments, the thinning process simultaneously removes portions of the through integrated fan-out via TIV2 and a portion of the encapsulation layer E2. Accordingly, the surface of the semiconductor die 300, the surfaces of the through integrated fan-out via TIV2 and the surface of the encapsulation layer E2 are flushed with each other.

Figure 12:
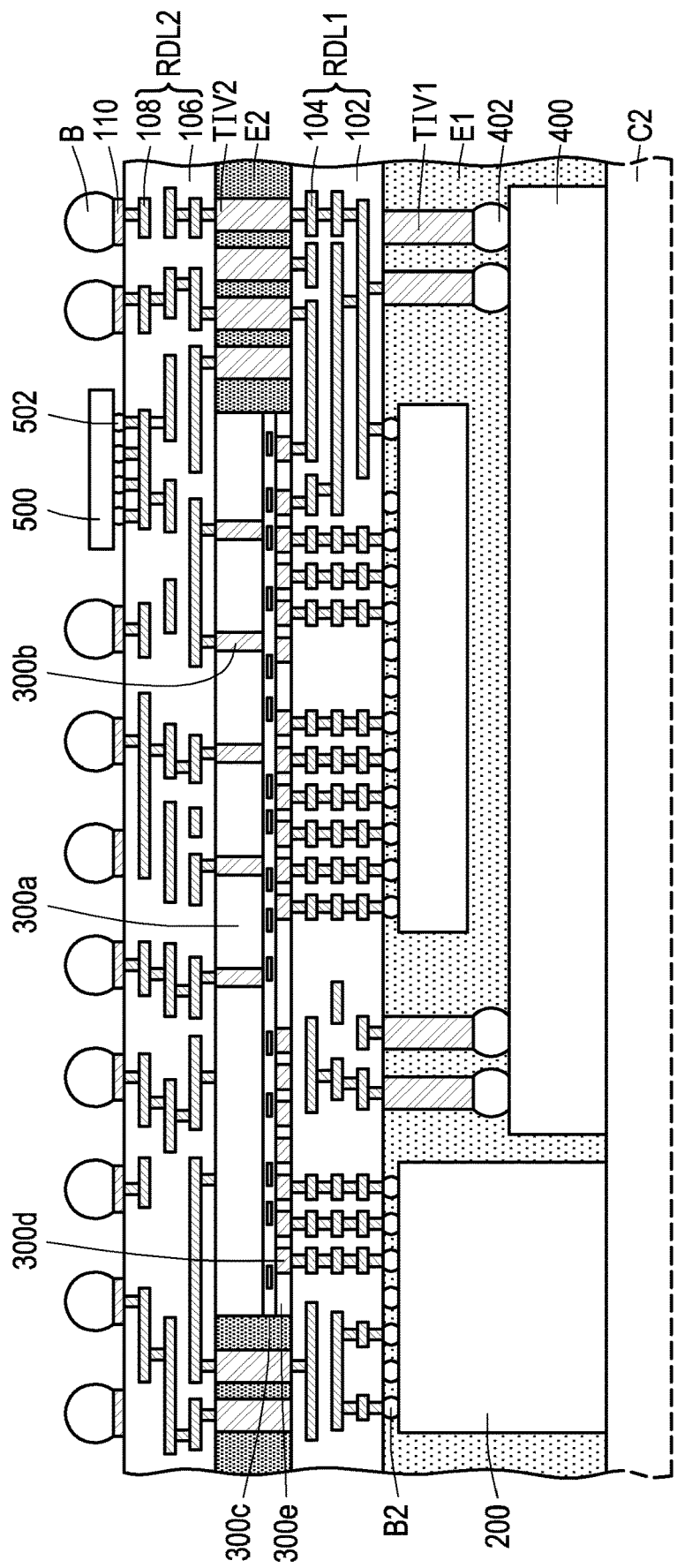

Referring to FIG. 12, a redistribution layer structure RDL2 is formed over and electrically connected to the semiconductor die 300 and the through integrated fan-out vias TIV2. In some embodiments, the redistribution layer structure RDL2 includes redistribution layers 108 embedded by polymer layers 106. In some embodiments, each of the redistribution layers 108 includes copper, nickel, titanium, the like, or a combination thereof, and is formed by photolithography, plating, and photoresist stripping processes. In some embodiments, each of the polymer layers 106 includes a polymer material such as polybenzoxazole (PBO), polyimide (PI), benzocyclobutene (BCB), a combination thereof or the like, and is formed by a suitable fabrication technique such as spin-coating, lamination, deposition or the like.

Afterwards, under bump metallization (UBM) pads 110 are formed over the redistribution layer structure RDL2. In some embodiments, the UBM pads 110 include copper, nickel, titanium, the like, or a combination thereof, and is formed by photolithography, plating, and photoresist stripping processes. The UBM pads 110 are regarded as part of the redistribution layer structure RDL2 in some examples.

In some embodiments, bumps B are formed over and electrically connected to the UBM pads 110. The bumps B include solder bumps, solder caps formed on metal pillars (e.g., copper pillars), or the like. The bumps B may be formed by a suitable process such as evaporation, electroplating, ball drop, or screen printing. The bumps B are referred to as "ball grid array (BGA) bumps" in some examples.

In some embodiments, at least one integrated passive device (IPD) 500 is provided and bonded to the redistribution layer structure RDL2 through the bumps 502. The integrated passive device 500 may include a capacitor, an inductor or a resistor, or the like. For example, the integrated passive device 500 is a capacitor. In some embodiments, the bumps 502 include solder bumps, solder caps formed on metal pillars (e.g., copper pillars), or the like. The bumps 502 may be formed by a suitable process such as evaporation, electroplating, ball drop, or screen printing.

Figure 13:
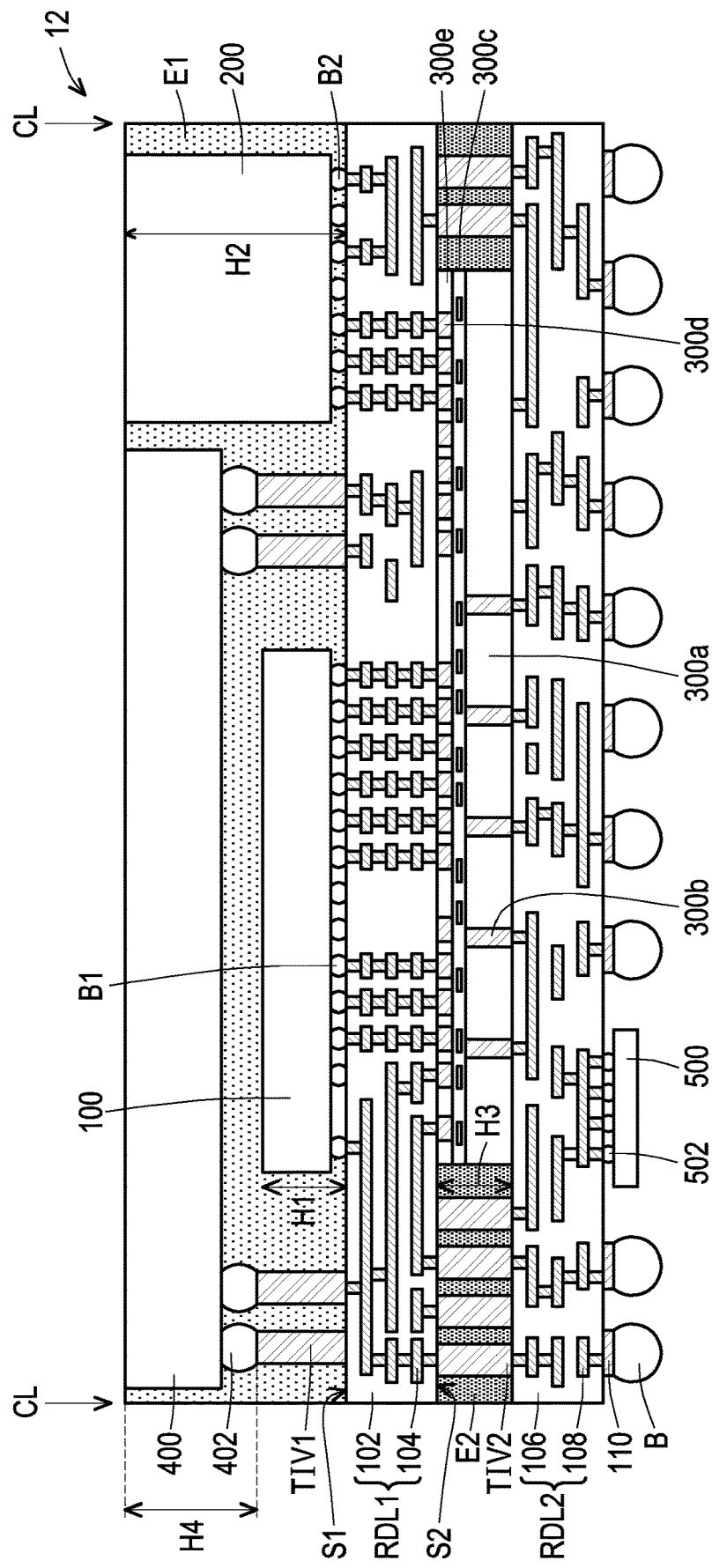

Referring to FIG. 13, the carrier C2 is then removed from the structure formed thereon. In some embodiments, the structure with the carrier C2 is turned over, such that the carrier C2 faces up for the subsequent processes. In some embodiments, the carrier C2 is debonded from the back sides of the semiconductor dies 200 and 400. In some embodiments, a debonding layer between the carrier C2 and the semiconductor dies 200 and 400 is decomposed under heat of light, and the carrier C2 is then released from the structure formed thereon. In some embodiments, the first DAF adhered to the semiconductor die 100 and the second DAF adhered to the semiconductor die 200 may be removed. In other embodiments, the first DAF adhered to the semiconductor die 100 and the second DAF adhered to the semiconductor die 200 may remain as needed.

Thereafter, a wafer dicing process is performed on the structure of FIG. 13 along the cutting lines CL, so as to cut through the encapsulation layer E1, the redistribution layer structure RDL2, the encapsulation layer E2 and the redistribution layer structure RDL1. After the wafer dicing process or singulation process, the adjacent integrated circuit packages 12 are separated from each other, as shown in FIG. 13. The integrated circuit package 12 of some embodiments is thus completed. In some embodiments, a board substrate such as a printed circuit board (PCB) and/or an interposer substrate such as a silicon interposer or an organic interposer may be provided below and bonded to the integrated circuit package 12 through the bumps B.

The structure of integrated circuit package of some embodiments are described below with reference to FIG. 13.

In some embodiments, an integrated circuit package 12 includes a first redistribution layer structure RDL1, a first semiconductor die 100, a second semiconductor die 200 and a third semiconductor die 300. The first redistribution layer structure RDL1 has a first side S1 and a second side S2 opposite to each other. The first semiconductor die 100 and a second semiconductor die 200 are electrically connected to the first side S1 of the first redistribution layer structure RDL1 and encapsulated by a first encapsulation layer E1, wherein the height H1 of the first semiconductor die 100 is less than the height H2 of the second semiconductor die 200, and the critical dimension of the second semiconductor die 200 is less than the critical dimension of the first semiconductor die 100.

In some embodiments, the integrated circuit package 12 further includes a fourth semiconductor die 400 stacked on the first semiconductor die 100, aside the second semiconductor die 200 and encapsulated by the first encapsulation layer E1.

In some embodiments, the height H2 of the semiconductor die 200 is greater than the height H1 of the semiconductor die 100. In some embodiments, the height H2 of the semiconductor die 200 is substantially equal to the total height of the height H1 of the semiconductor die 100 and the height H4 of the semiconductor die 400.

In some embodiments, the height H1 of the semiconductor die 100 ranges from about 200 um to 500 um, and the height H2 of the semiconductor die 200 ranges from about 600 urn to 1000 urn, and the height H4 of the semiconductor die 400 ranges from about 200 urn to 500 urn. In some embodiments, the height H3 of the semiconductor die 300 ranges from about 200 urn to 500 urn.

In some embodiments, a surface of the fourth semiconductor die 400 is flushed with a surface of the second semiconductor die 200. In some embodiments, the integrated circuit package 12 further includes a second redistribution layer structure RDL2 electrically connected to the third semiconductor die 300 and opposite to the first distribution layer structure RDL1. In some embodiments, the integrated circuit package 12 further includes bumps B electrically connected to the second redistribution layer structure RDL2 and opposite to the third semiconductor die 300. In some embodiments, the integrated circuit package 12 further includes at least one integrated passive device 500 electrically connected to the second redistribution layer structure RDL2 and opposite to the third semiconductor die 300.

In view of the above, in some embodiments of the present disclosure, with novel arrangement of multiple chips in different levels or tiers, the heat dissipation efficiency is effectively improved by increasing silicon thickness of the high-performance die without increasing the total height of the multi-chip semiconductor package.

In accordance with some embodiments of the present disclosure, a method of an integrated circuit package includes following operations. A padding layer is formed on a portion of a carrier. A first semiconductor die is placed on the padding layer and a second semiconductor die is placed on the carrier. The first semiconductor die and the second semiconductor die are encapsulated with a first encapsulation layer. A first redistribution layer structure is formed over the first semiconductor die, the second semiconductor die and the first encapsulation layer. A third semiconductor die is placed on the first redistribution layer structure. The third semiconductor die is encapsulated with a second encapsulation layer. A second redistribution layer structure is formed over the third semiconductor die and the second encapsulation layer. The carrier is debonded. The padding layer is removed, and therefore, a recess is formed in the first encapsulation layer.

In accordance with some embodiments of the present disclosure, an integrated circuit package includes a first redistribution layer structure, a first semiconductor die, a second semiconductor die and a third semiconductor die. The first redistribution layer structure having a first side and a second side opposite to each other. The first semiconductor die and a second semiconductor die are electrically connected to the first side of the first redistribution layer structure and encapsulated by a first encapsulation layer, wherein the first semiconductor die and the second semiconductor die have different heights, the first encapsulation layer has a first portion and a second portion protruded from a top surface of the first portion and a sidewall of the second portion is exposed, the first portion encapsulates the first semiconductor die, and the second portion encapsulates the second semiconductor die. The third semiconductor die is electrically connected to the second side of the first redistribution layer structure and encapsulated by a second encapsulation layer.

In accordance with some embodiments of the present disclosure, a method of forming an integrated circuit package includes the following operations. A first carrier is provided. A lower semiconductor die is placed on the first carrier. The lower semiconductor die is encapsulated with a lower encapsulation layer. A first redistribution layer structure is formed over the lower semiconductor die. A first semiconductor die and a second semiconductor die are placed side by side on the first redistribution layer and an upper semiconductor die is placed on the first semiconductor die. The first semiconductor die, the second semiconductor die and the upper semiconductor die are encapsulated with an upper encapsulation layer. A second carrier is bonded to the second semiconductor die and the upper semiconductor die. The first carrier is debonded.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit package, comprising:
   forming a padding layer on a portion of a carrier;
   placing a first semiconductor die on the padding layer and placing a second semiconductor die on the carrier;
   encapsulating the first semiconductor die and the second semiconductor die with a first encapsulation layer;
   forming a first redistribution layer structure over the first semiconductor die, the second semiconductor die and the first encapsulation layer;
   placing a third semiconductor die on the first redistribution layer structure;
   encapsulating the third semiconductor die with a second encapsulation layer;
   forming a second redistribution layer structure over the third semiconductor die and the second encapsulation layer;
   debonding the carrier; and
   removing the padding layer and therefore forming a recess in the first encapsulation layer.

2. The method of claim 1, further comprising forming a fourth semiconductor die over the first semiconductor die and in the recess of the first encapsulation layer.

3. The method of claim 2, further comprising forming an underfill layer between the first semiconductor die and the fourth semiconductor die.

4. The method of claim 1, further comprising forming first through vias on the padding layer and around the first semiconductor die before placing the first and second semiconductor dies.

5. The method of claim 1, further comprising forming bumps on the second redistribution layer structure before debonding the carrier.

6. The method of claim 1, further comprising forming at least one integrated passive device on the second redistribution layer structure before debonding the carrier.

7. The method of claim 1, wherein a method of forming the padding layer comprises forming a photolithography process.

8. The method of claim 1, wherein a method of forming the padding layer comprises forming a depositing process followed by a laser drilling process.

9. The method of claim 1, wherein a critical dimension of the second semiconductor die is less than a critical dimension of the first semiconductor die.

10. A method of forming an integrated circuit package, comprising:
    providing a first carrier;
    placing a lower semiconductor die on the first carrier;
    encapsulating the lower semiconductor die with a lower encapsulation layer;
    forming a first redistribution layer structure over the lower semiconductor die;
    placing a first semiconductor die and a second semiconductor die side by side on the first redistribution layer and placing an upper semiconductor die on the first semiconductor die;
    encapsulating the first semiconductor die, the second semiconductor die and the upper semiconductor die with a same upper encapsulation layer;
    bonding a second carrier to the second semiconductor die and the upper semiconductor die; and
    debonding the first carrier.

11. The method of claim 10, further comprising forming a second redistribution layer structure over the lower semiconductor die after debonding the first carrier.

12. The method of claim 11, further comprising forming bumps on the second redistribution layer structure.

13. The method of claim 10, wherein a top surface of the second semiconductor die is flush with a top surface of the upper semiconductor die.

14. A method of forming an integrated circuit package, comprising:
    forming a dummy layer on a portion of a carrier;
    forming a first semiconductor die on the dummy layer and forming a second semiconductor die on the carrier;
    forming a third semiconductor die on the first semiconductor die and the second semiconductor die, wherein the third semiconductor die is partially overlapped with the first semiconductor die and the second semiconductor die in a cross-sectional view;
    debonding the carrier;
    removing the dummy layer and therefore exposing the first semiconductor die; and
    forming a fourth semiconductor die on the first semiconductor die opposite to the third semiconductor die.

15. The method of claim 14, wherein a surface of the fourth semiconductor die is flush with a surface of the second semiconductor die.

16. The method of claim 14, further comprising forming a fifth semiconductor die on the third semiconductor die opposite to the first semiconductor die.

17. The method of claim 16, wherein the fifth semiconductor die comprises an integrated passive device.

18. The method of claim 14 wherein a method of forming the dummy layer comprises forming a photolithography process.

19. The method of claim 14, wherein a method of forming the dummy layer comprises forming a depositing process followed by a laser drilling process.

20. The method of claim 14, wherein a critical dimension of the second semiconductor die is less than a critical dimension of the first semiconductor die.

* * * * *